United States Patent [19]

Mahmood

[11] Patent Number: 5,602,496
[45] Date of Patent: Feb. 11, 1997

[54] INPUT BUFFER CIRCUIT INCLUDING AN INPUT LEVEL TRANSLATOR WITH SLEEP FUNCTION

[75] Inventor: Qazi Mahmood, San Jose, Calif.

[73] Assignee: Advanced Micro Devices, Inc., Sunnyvale, Calif.

[21] Appl. No.: 652,888

[22] Filed: May 23, 1996

Related U.S. Application Data

[63] Continuation of Ser. No. 396,850, Mar. 1, 1995, abandoned, which is a continuation-in-part of Ser. No. 78,795, Jun. 17, 1992, abandoned.

[51] Int. Cl.⁶ .................... H03K 19/0185; H03K 3/295; H03K 19/0948
[52] U.S. Cl. .................. 326/71; 326/24; 326/68; 326/83; 327/206
[58] Field of Search .................. 326/63, 68, 70–71, 326/21, 23, 24, 33–34, 83, 86, 121; 327/205–206, 544

[56] References Cited

U.S. PATENT DOCUMENTS

| | | | |
|---|---|---|---|
| 3,984,703 | 10/1976 | Jorgensen | 327/206 |
| 4,451,745 | 5/1984 | Itoh et al. | 326/83 |
| 4,563,595 | 1/1986 | Bose | 327/206 |
| 4,680,491 | 7/1987 | Yokouchi et al. | 326/86 |
| 4,687,954 | 8/1987 | Yasuda et al. | 327/206 |
| 4,739,193 | 4/1988 | Doty, II | 326/83 |
| 5,073,726 | 12/1991 | Kato et al. | 326/24 |
| 5,194,767 | 3/1993 | Chao | 326/71 |
| 5,216,299 | 6/1993 | Wanlass | 326/71 |
| 5,341,033 | 8/1994 | Koker | 327/206 |

FOREIGN PATENT DOCUMENTS

2198902  6/1988  United Kingdom.

Primary Examiner—Edward P. Westin
Assistant Examiner—Jon Santamauro
Attorney, Agent, or Firm—Benman Collins & Sawyer

[57] ABSTRACT

An input buffer circuit is disclosed which provides better noise margin and sharper switching edges than previously known systems. This circuit includes an input level translator, a Schmitt trigger circuit coupled to the input level translator circuit, a buffer, and sleep function circuit. The sleep function circuit reduces power when the input buffer circuit is powered down. The Schmitt trigger circuit comprises the hysteresis transfer characteristic providing means of the present invention. The Schmitt trigger circuit and buffer circuit, both with properly matched beta values for the participating transistors, allows for improved noise immunity of and sharper switching edges for the input buffer of the present invention.

16 Claims, 8 Drawing Sheets

INPUT BUFFER CIRCUIT INCLUDING AN INPUT LEVEL TRANSLATOR WITH SLEEP FUNCTION

This application is a continuation of applications(s) Ser. No. 08/396,850 filed on Mar. 1, 1995, now abandoned, which is a continuation-in-part of Ser. No. 08/078,795, filed on Jun. 17, 1993, now abandoned.

FIELD OF THE INVENTION

The present invention relates to an input level translator utilized in an input buffer circuit for an integrated circuit (IC). More particularly, the present invention relates to an input level translator that includes a sleep function that is utilized with a CMOS IC.

BACKGROUND OF THE INVENTION

Input level translators are generally used in CMOS integrated circuit (IC) input buffers to convert TTL signals to CMOS signals that are utilized within the IC. Specifically, the input level translator converts TTL signals which typically have low voltage levels of eight-tenths (0.8) volts and high voltage levels of two (2) volts to CMOS signal levels having $V_{ss}$ as a logical zero and $V_{cc}$ as a logical one.

This signal level conversion is necessary because the TTL levels are not stable enough to provide for the transitions required for CMOS circuits. In a input buffer circuit, the input level translator is followed by a driver circuit. This driver then drives the TTL levels to the appropriate CMOS levels for use by the IC. Accordingly, the input level translator circuit translates the input signal, and the driver circuit drives the translated input signal to the output of the input buffer.

Normally, the translator is an inverter which is ratioed in such a manner that a low TTL signal (0.8 volts or less) provides a high CMOS output and a high TTL signal (2 volts or more) provides a low CMOS output. What is meant by ratioed is that the width to length ratio of the transistors within the level translators are sized in such a fashion in order to provide the appropriate level translator.

Thus, the level translator and the CMOS circuit driver are ratioed in such a fashion as to achieve the desired output levels with appropriate applied input, in order to provide full CMOS levels to all the subsequent stages. If the translation's edge rate is not sharp, then in subsequent stages of the CMOS circuit, the circuit will stay on for a longer period of time. Hence, a typical CMOS circuit experiences a DC power drain due to the circuit having a DC path to $V_{ss}$, and an attendant loss of effectiveness.

CMOS circuits are oftentimes required to be in a "sleep" or "standby" mode in which the circuit is powered down. This is done to conserve power in an environment where power saving is a priority. When a CMOS circuit is in a sleep mode, the power used by the IC is significantly lower than that consumed during normal operation and the internal gates and buffers of the circuit retain the state that they had when the circuit was active.

If the circuit is in the sleep mode, the input translator circuit of the input buffer circuit must also be in sleep mode. If not powered down, the input translator circuit will draw DC and ac switching currents. In the prior art, sleep mode is accomplished by utilizing a "NAND" gate or a "NOR" gate to receive a disabling or an enabling signal to place the IC into sleep or active condition respectively.

Although the input buffer circuit is in the sleep mode, when the level translator becomes inactive and drawing no active power, a minute amount of leakage current is still drawn in the form of "sub threshold" and "p-n" junction leakage currents within the input level translator.

Another problem such input level translator circuits face is that the perturbations from the power supply may cause erroneous switching problems at the output of the CMOS circuit. Additionally, a third problem may result when, for example, noise on the input signal causes a change in the output. For instance, when the input signal level may be at some intermediate level between $V_{IL}$ and $V_{IH}$, an unwanted change in the output signal may occur. Therefore, it is important to ensure that the changes occur at either $V_{IL}$ or $V_{IH}$ at all times.

Therefore, it is desirable to provide an input buffer circuit that includes an input level translator which overcomes the DC power drain and noise-sensitive switching problems of previously known level translator circuits. It is also desirable to have such a circuit that includes a sleep function that reduces power when the IC is in a standby or power-down mode.

SUMMARY OF THE INVENTION

The present invention comprises an improved input buffer circuit for an integrated circuit (IC). The input buffer circuit comprises, in addition, an input level translator means for converting an input signal level to a logic signal, a means coupled to input level translator means for providing a hysteresis transfer characteristic to the input signal, and a buffer means coupled to the input level translator means. The input buffer circuit also includes means coupled to the input level translator means for reducing the power consumption of the input buffer circuit.

The transfer characteristic providing means is preferably implemented as a Schmitt trigger circuit. A Schmitt trigger circuit has several advantages. A first benefit of such a circuit is that it provides for better noise margin between the input levels. Accordingly, this circuit inhibits switching in the intermediate input levels between $V_{IL}$ and $V_{IH}$. Thus, there is better noise immunity from both power supply noise and input noise.

The buffer means is preferably an inverter circuit. The inverter circuit includes a pull-up and a pull-down transistor having ratioed beta values to compensate for the Schmitt trigger circuit. The resultant output voltage values from the input buffer circuit are closer to CMOS voltage levels.

Finally, the sharp edge transitions made possible by the hysteresis transfer characteristic helps to reduce any power drain between $V_{cc}$ and $V_{ss}$.

The apparatus of the present invention offers significant advantages over previously known CMOS input buffer circuits.

DETAILED DESCRIPTION

The present invention relates to an improvement in input buffer circuits used in integrated circuit (IC) chips. In particular, the present invention is directed toward an input buffer which has better noise immunity and provides for sharper switching edges than previously known input buffers for use in CMOS circuits. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1A:
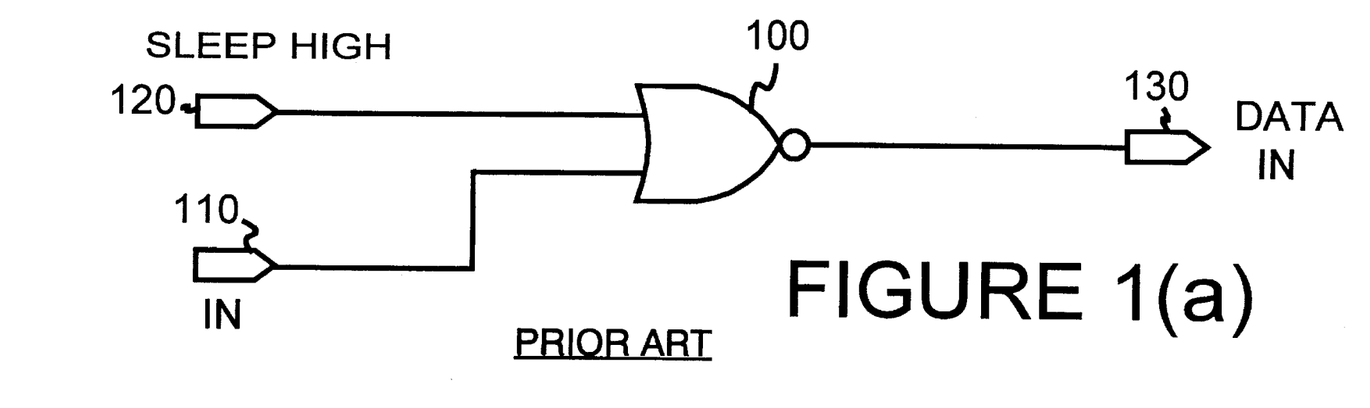
FIG. 1(a) is an input level translator in accordance with the prior art having an active high sleep signal.
Figure 1B:
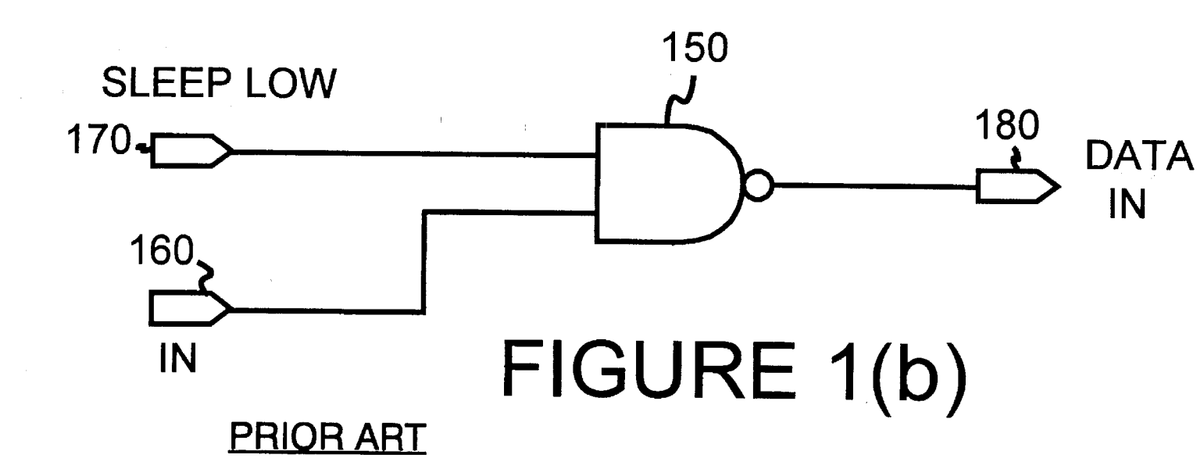
FIG. 1(b) is an input level translator in accordance with the prior art having an active low sleep signal.

Referring now to FIGS. 1a and 1b, what is shown are input level translator circuits 100, 150 in accordance with the prior art. FIG. 1(a) shows a level translator circuit 100 with an active high sleep signal 120. The input level translator 100 utilizes a "NOR" gate which, responsive, to a high sleep signal input to the translator circuit 100, would put the input buffer circuit into a sleep or powered down mode.

FIG. 1(b) shows an input level translator circuit 150 having an active low sleep signal input 170. The input level translator 150 utilizes a NAND gate which, responsive to an active low sleep signal, would put the input buffer circuit into a sleep or powered down mode.

The circuits 100, 150 above discussed are typical input buffer circuits. A change in the input voltage leads to an output response whether or not the response is desirable. Therefore, both suffer from the DC power drain problems discussed above as well as the anomalous switching problems associated with the input buffer circuits of the prior art.

The present invention provides for an improved input buffer circuit which has a sharper switching edge. Thus, while the input voltage may increase from its minimum value to its maximum value, an input buffer in accordance with the present invention will experience switching of the input buffer output voltage only at the extremes of the input voltage. If, as the input voltage varies, variations in the input buffer output voltage occur only at the extreme values of the input voltage, a graph of input voltage versus output voltage takes on the appearance of a hysteresis loop, which in the context of the present invention is called a hysteresis transfer characteristic. Since the hysteresis transfer characteristic allows for variations in the output voltage levels only at the minimum or maximum values of the input voltage, an input buffer which incorporates the hysteresis transfer characteristic would be much less noise-sensitive and provide for sharper switching edges.

The present invention takes advantage of the use of hysteresis transfer characteristic for eliminating switching and noise problems associated with prior art level translators within input buffer circuits. To more particularly describe the advantages of this feature, refer now to FIG. 2 which shows an idealized hysteresis transfer characteristic diagram.

Figure 2:
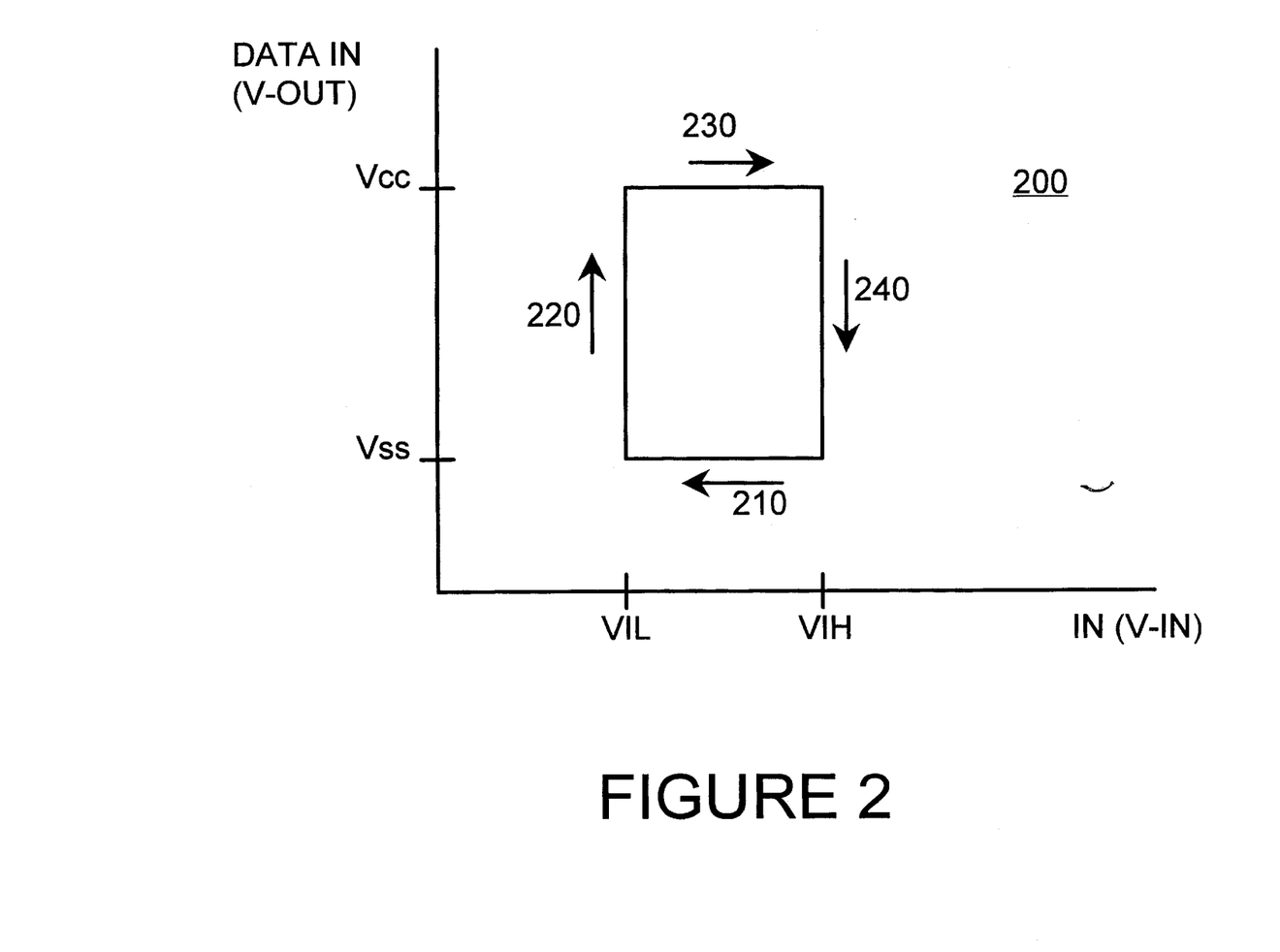
FIG. 2 shows an ideal hysteresis transfer characteristic of the Schmitt trigger circuit in accordance with the present invention.

Referring now to FIG. 2, what is seen is a chart of $V_{IH}$ to $V_{IL}$ when the level translator exhibits the ideal hysteresis transfer characteristic 200. As the input voltage drops from its high level $V_{IH}$ to its low value $V_{IL}$ 210, the output of the translator circuit remains at its low value $V_{ss}$. Only when the input signal level approaches $V_{IL}$ does the output level, which is actually the value of the input signal to the IC, undergo a transition 220 to its high value of $V_{cc}$. When the input signal level undergoes a transition from $V_{IL}$ to $V_{IH}$ 230, the IC input level remains stable and constant until the signal approaches $V_{IH}$ and, then, undergoes the transition 240 from $V_{cc}$ to $V_{ss}$.

Thus, the means for providing a hysteresis transfer characteristic of the present invention provides for stable switching as the input signal level varies between $V_{IL}$ and $V_{IH}$. As a further consequence of the hysteresis transfer characteristic, sharper switching transitions between $V_{IL\ and\ VIH}$ · as well as $V_{ss}$ and $V_{cc}$ are made possible. A preferred way of achieving the characteristics above described is by including a Schmitt trigger in the input buffer circuit.

Figure 3:
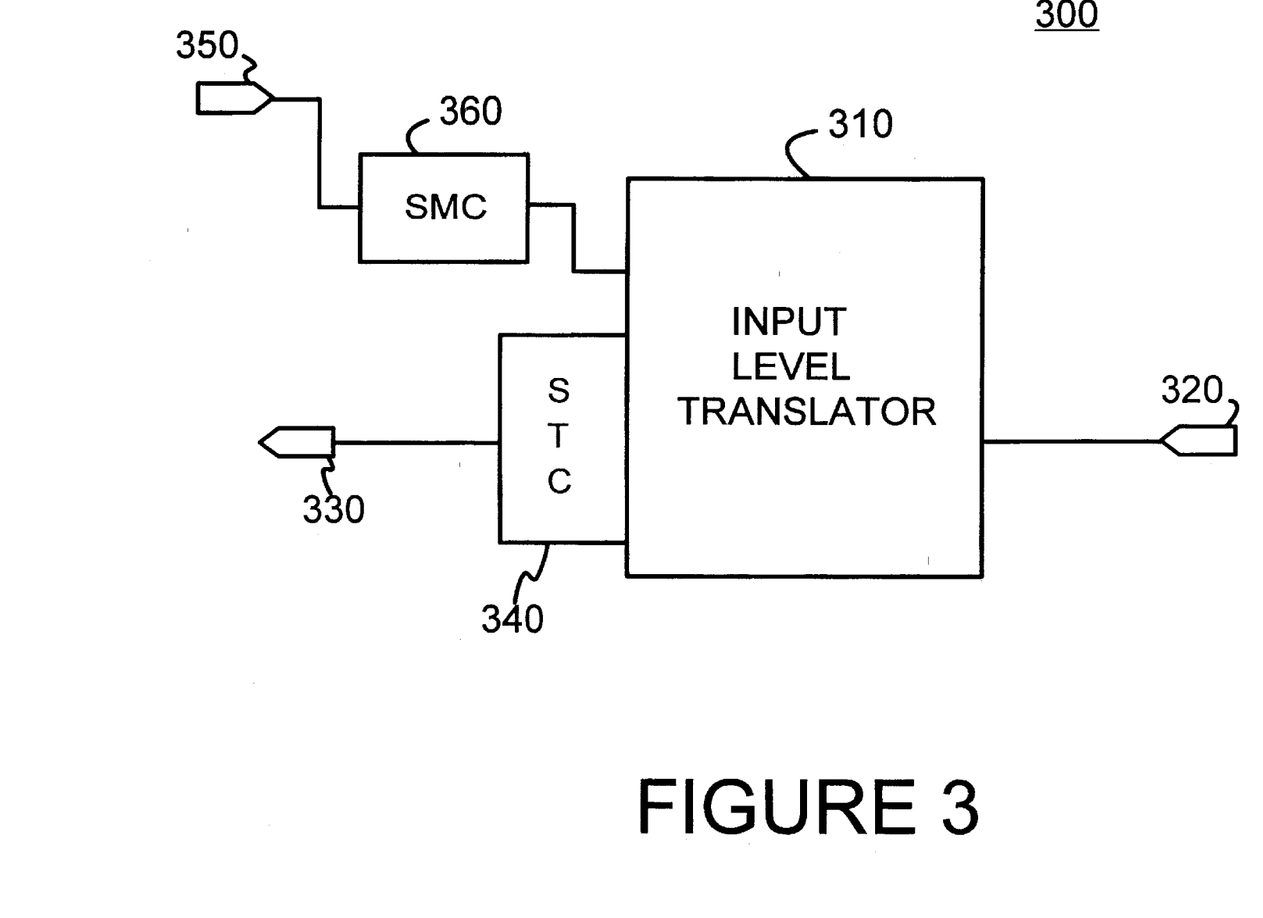
FIG. 3 is a block diagram of an input buffer circuit in accordance with the present invention.

In FIG. 3, a block diagram of the input buffer 300 in accordance with the present invention is shown. The input buffer circuit includes an input level translator 310 that receives an input signal 320. The translator 310 is coupled to Schmitt trigger circuit 340. The Schmitt trigger circuit 340 is coupled to provide the input signal to the IC (not shown) at 330. The input level translator 310 is also coupled to a sleep mode circuit 360. The sleep mode circuit receives input signals via 350. In a more typical operation, the input level translator 310 receives an input signal via line 320. The Schmitt trigger circuit 340 provides the desired hysteresis transfer characteristic before sending the appropriate CMOS input signal 330. When the input buffer 300 is to be placed into a sleep condition, a sleep input signal 350 is provided to sleep function circuit 360.

It should be understood that although a Schmitt trigger circuit is described in the preferred embodiment as the means for providing the sharper switching edges, there are a variety of other ways to provide the transfer characteristics and those ways would be within the spirit and scope of the present invention.

Accordingly, when the input level translator 310 receives an input signal, the level of the signal is sensed by the Schmitt trigger 340 and is sent at the appropriate level to the input of the IC via line 330. Hence, for example, if the signal sensed by Schmitt trigger circuit 340 is above a certain value, for example two (2) volts, or below a certain value, for example 0.8 volts, the Schmitt trigger circuit 340 will provide a logical high or low signal respectively via line 330. If however, the signal is at some intermediate value then the signal at 330 will not change. Hence, there is improved noise immunity and sharper switching transitions utilizing the circuit 340.

Figure 4:
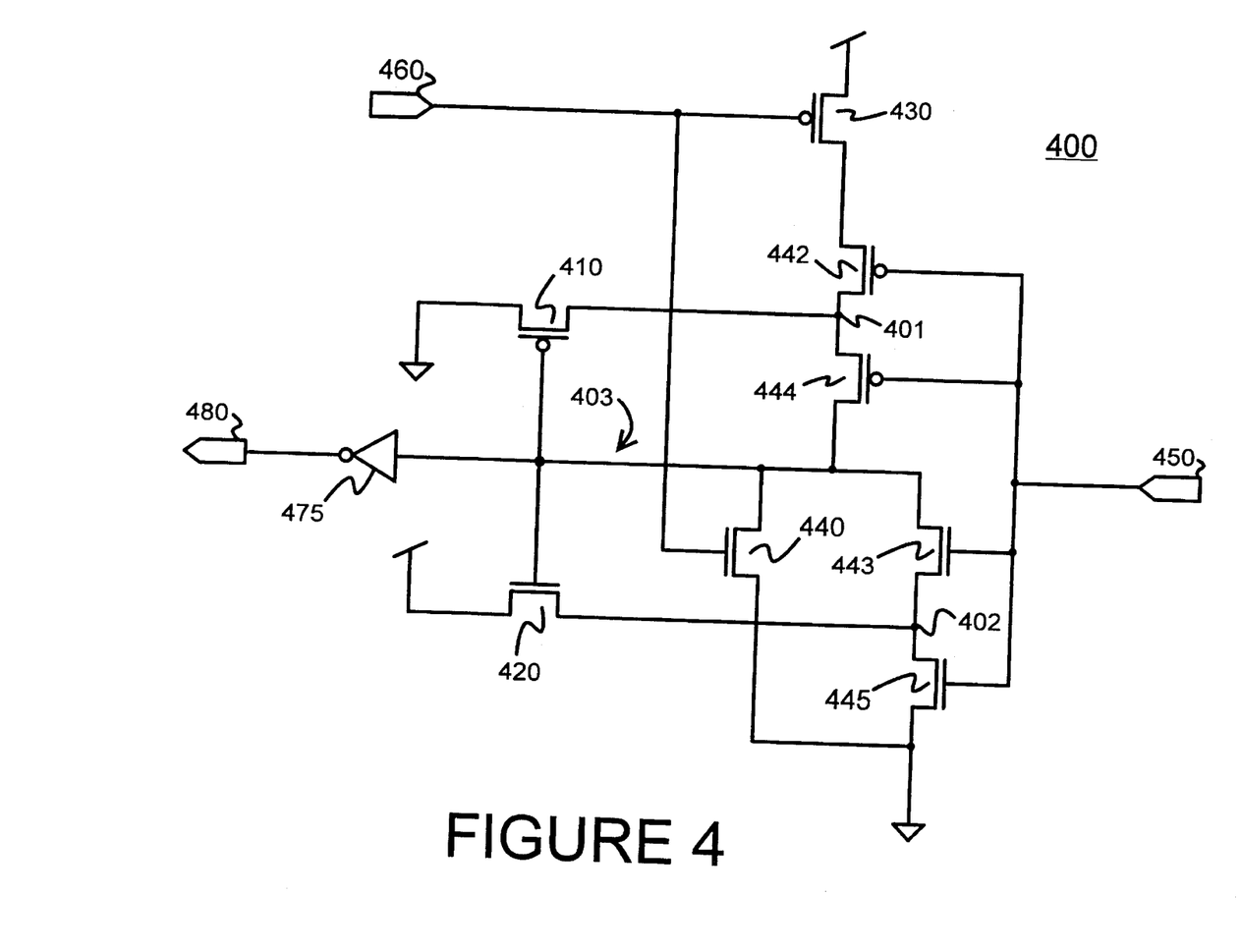
FIG. 4 is a detailed diagram of an input buffer circuit in accordance with the present invention in which the sleep signal is active high.
Figure 5:
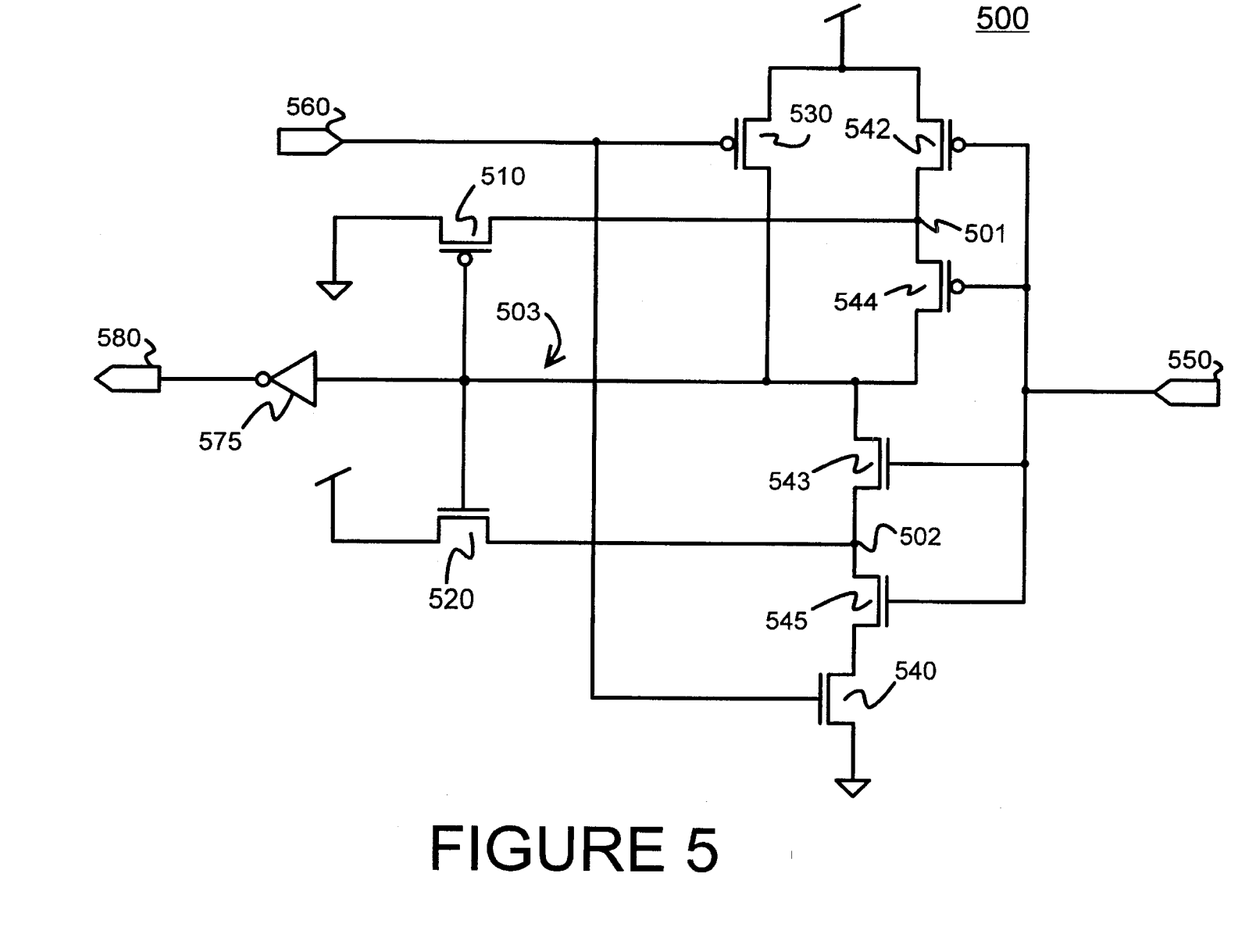
FIG. 5 is a detailed diagram of a second embodiment of an input buffer circuit in accordance with the present invention.

To more particularly describe the present invention, refer now to FIGS. 4 and 5 which show more detailed embodiments of the block diagram of FIG. 3.

FIG. 4 shows a first embodiment of an input buffer circuit 400 in accordance with the present invention. In this embodiment an active high signal input 460 minimizes the power consumed by circuit 400. In this circuit, the input 450 from an external circuit (not shown) is coupled to the gates of pmos transistor 442, pmos transistor 444, nmos transistor 443 and nmos transistor 445. The source of transistor 442 is coupled to the drain of pmos transistor 430. The source of transistor 430 is coupled to $V_{cc}$. The gate of transistor 430 is coupled to sleep input 460 and the gate of nmos transistor 440.

The drain of transistor 442 is coupled to the source of transistor 444. The drain of transistor 444 is coupled to the drain of transistor 443 and node 403. The source of transistor 443 is coupled to the drain of transistor 445. The source of transistor 445 is coupled to $V_{ss}$ and to the source of transistor 440. The drain of nmos transistor 440 is coupled to the drain of transistor 444, the drain of transistor 443, and node 403; and an input of an inverter 475, the output of inverter 475 is coupled to the input signal 480.

The gate of pmos transistor 410 is coupled to the gate of the nmos transistor 420 to node 403. The drain of the transistor 410 is coupled to the node 401. The source of transistor 410 is coupled to $V_{ss}$. The source of the nmos transistor 420 is coupled to the node 402. The drain of transistor 420 is coupled to $V_{cc}$.

Transistors 410 and 420 comprise the Schmitt trigger circuit. Transistors 430 and 440 comprise the sleep function circuit.

FIG. 5 shows a second embodiment of an input buffer circuit 500 in accordance with the present invention. In this embodiment, an active low signal at input 560 reduces the power consumed by circuit 500. In this circuit, an input 550 from an external circuit (not shown) is coupled to the gates of pmos transistor 542, pmos transistor 544, nmos transistor 543 and nmos transistor 545. The source of transistor 545 is coupled to the drain of nmos transistor 540. The source of transistor 540 is coupled to $V_{ss}$. The gate of transistor 540 is coupled to sleep input 560 and the gate of pmos transistor 530.

The drain of transistor 542 is coupled to the source of transistor 544. The drain of transistor 544 is coupled to the drain of transistor 543 and node 503. The drain of transistor 543 is also coupled to the drain of transistor 545 and the drain of transistor 530. The source of transistor 530 is coupled to the source of transistor 542 which are in turn coupled to $V_{cc}$. The drain of transistor 530 is coupled to the drain of transistor 544, the drain of transistor 543 and an input of an inverter 503. The output of inverter 503 is coupled to the input signal 580.

The gate of pmos transistor 510 is coupled to the gate of the nmos transistor 520 and input of the inverter 575. The drain of the transistor 510 is coupled to the node 501. The source of transistor 510 is coupled to $V_{ss}$. The source of the nmos transistor 520 is coupled to node 502. The drain of transistor 520 is coupled to $V_{cc}$. Transistors 510 and 520 comprise the Schmitt trigger circuit. Transistors 530 and 540 comprise the sleep function circuit.

Both of these circuits 400 and 500 utilize an input level translator, a Schmitt trigger circuit and a sleep function circuit. As has been mentioned before, in circuit 400, an active high signal initiates the sleep function to reduce power consumption while in circuit 500, an active low initiates the sleep function. The two circuits 400 and 500 are complementary, hence the present invention will be discussed in terms of the circuit 400. One of ordinary skill in the art will readily recognize that the operation of the circuit 500, through the use of similar principles, will be the same as the operation of circuit 400.

Referring again to FIG. 4, when the sleep signal input to the input buffer circuit 400 is high, the sleep signal input pmos transistor 430 is off. The nmos transistor 440 having its gate coupled to the sleep signal input is conducting current. Therefore, the circuit 400 is cut-off from its power supply. In addition, the output node 480 is held at its maximum value, $V_{cc}$, by the inverter 475. Details of inverter 475 are presented more fully with reference to FIG. 8.

Figure 6:
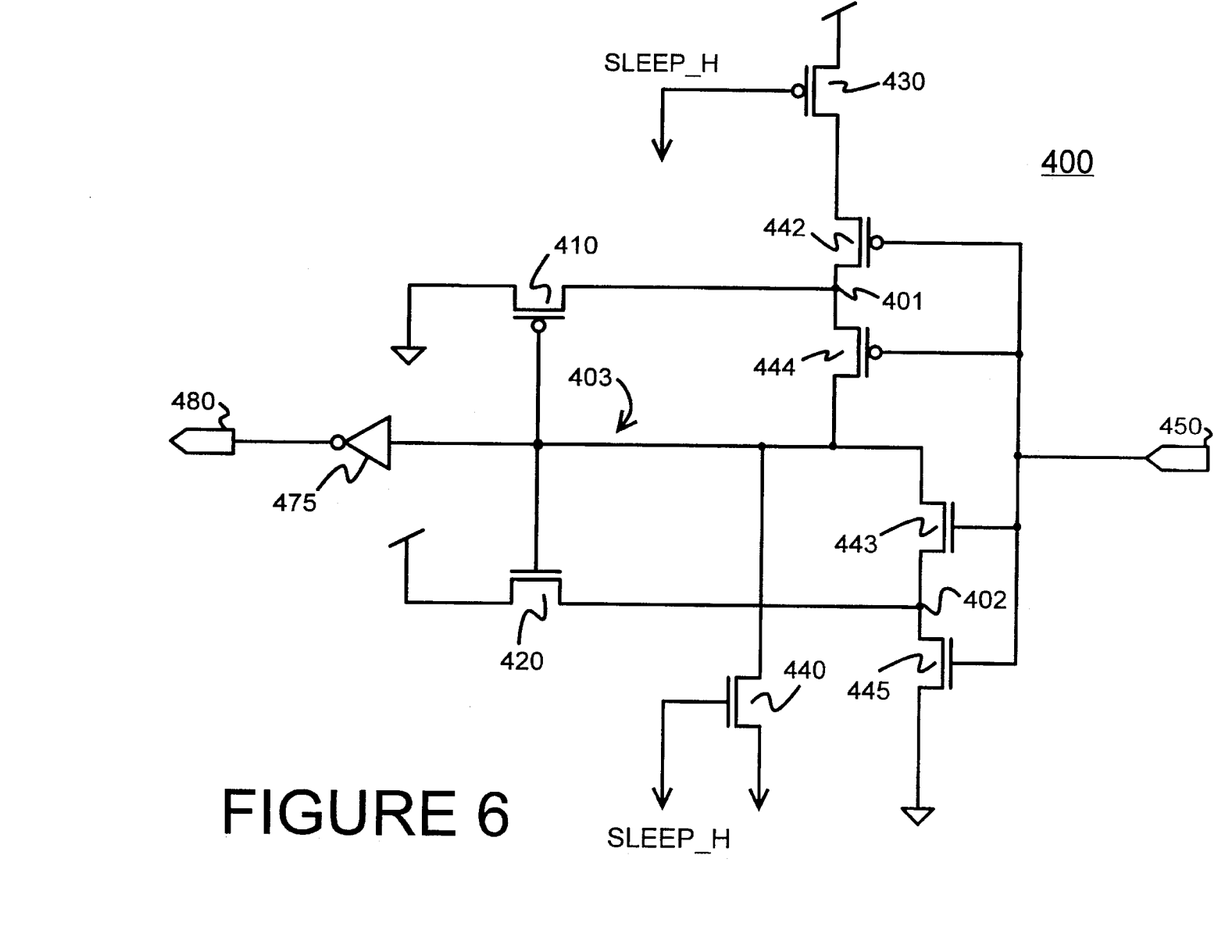
FIG. 6 shows the input buffer circuit of the first embodiment when in the normal operating mode.

When the sleep signal input 460 is not active high, the pmos transistor 430 conducts current, while the nmos transistor 440 does not. The circuit for the embodiment having the input buffer 400 function as a level translator circuit is shown in FIG. 6. Hence, in FIG. 6, the gates of transistor 430 and 440 of FIG. 4 are coupled to $V_{ss}$. During the transition of the input signal level from a low value of $V_{IL}$ to a maximum value of $V_{IH}$ and back, this circuit displays a hysteresis transfer characteristic as shown in FIG. 7 which shows the node voltage versus the input voltage when the input voltage starts from $V_{IL}$ goes to $V_{IH}$ and then returns to $V_{IL}$.

Figure 7:
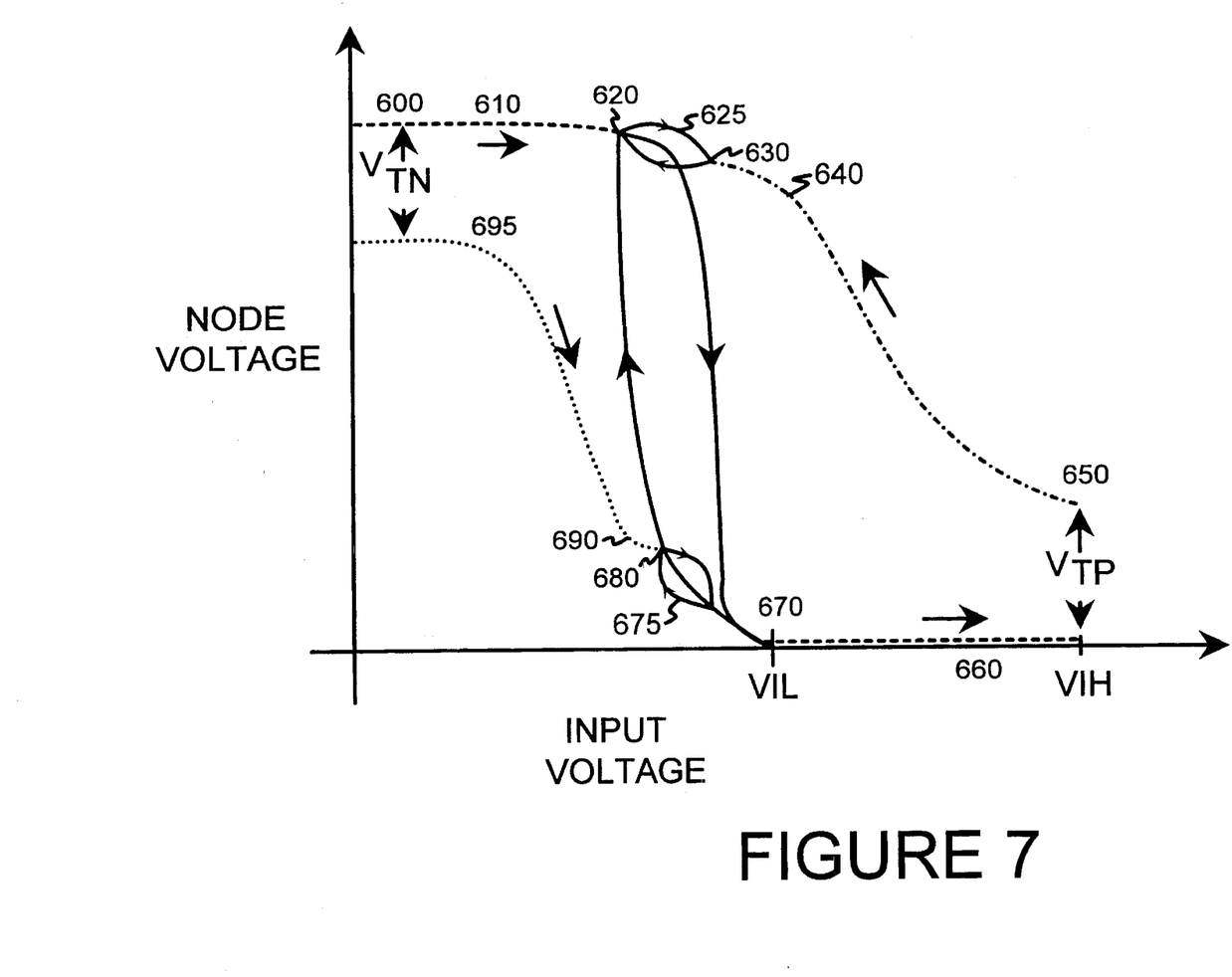
FIG. 7 shows the hysteresis transfer characteristic of the first embodiment.

Referring now to both FIGS. 6 and 7, when the input signal is at $V_{IL}$ indicated by 600, the pmos transistors 442 and 444 are on, keeping nodes 401 and 403 at a high output voltage level. For circuits which are not ratioed this value will be $V_{cc}$. Also, the nmos transistors 443 and 445 are not conducting current. The Schmitt trigger nmos transistor 420 is saturated and keeps the node 402 at a value between $V_{ss}$ and $V_{cc}$ ($V_{cc}-V_{TH}$) where $V_{TH}$ is a voltage threshold drop.

As the input voltage increases to the value $V_{TH}$ as indicated by 610, the nmos transistor 445 begins conducting current. As current flows through the nmos transistors 445 and 420, nmos transistor 420 tends to keep the value of node 403 high. However, the stronger gate drive of the nmos transistor 445 causes the voltage at the node 402 to drop.

The continued increase in the input voltage and the decrease in the voltage of the node 402, indicated by 620 causes the nmos transistor 443 to begin conducting current. A DC current begins to flow through the pmos transistors 442 and 444, and the nmos transistors 443 and 445 which causes the voltage at the nodes 401 and 403 to fall. The decreasing voltage at the node 403 causes the current through the nmos transistor 420 to decrease.

A further increase in the input voltage as indicated by 625 brings about an increase in the voltage drop across the pmos transistor 444, which causes current to begin flowing through the Schmitt trigger pmos transistor 410. The flow of current through the pmos transistor 410 causes the voltage at the node 401 to rapidly drop. The drop in the node voltage results in a further decrease in the current flowing through the pmos transistor 444. The weakened pmos transistor 444 causes the voltage at the node 403 to rapidly drop. Consequently, the current through the nmos transistors 443, 445, and 420 begins to drop as well.

When the input voltage reaches its maximum value $V_{IH}$ as indicated by 630, the voltage at the node 403 is sufficiently low to turn off the Schmitt trigger nmos transistor 420. As the pmos transistors 442 and the pmos transistor 444 are further weakened, causing the voltage at the node 401 to level off, the node 402 is pulled all the way to its minimum value, as is the node 403.

While the input voltage remains near the maximum value $V_{IH}$ as indicated by 640, the pmos transistor 444 is completely shut off as the difference between the voltage at the node 401 and the input voltage becomes less than $V_{TP}$. With the Schmitt trigger pmos transistor 410 still on and the gate drive of the pmos transistor 442 weakened, the voltage at the node 401 rapidly drops toward ground.

As the input voltage approximates $V_{cc}-V_{TP}$, where $V_{TP}$ =Voltage threshold drop indicated by 650, the pmos transistor 442 is cut off and causes the voltage at the node 401 to clamp at $V_{TP}$ above ground.

Still referring to FIGS. 6 and 7, the transition from input signal level $V_{IH}$ to input signal level $V_{IL}$ begins with the input near the maximum value $V_{IH}$ as indicated by 650. Then, the nmos transistor 443 and 445 are on, keeping the voltage at the node 403 at a low value. Since the pmos transistor 410 is saturated, it keeps the node 401 at $V_{TP}$ above ground.

As the input voltage begins to fall as indicated by 660, the pmos transistor 442 begins to conduct current. Then, current begins to flow through the pmos transistors 430, 442 and 410. While the strongly turned on pmos transistor 410 keeps the voltage at the node 401 at a low value, the increasingly stronger pmos transistor 442 tends to increase the node voltage at 401.

As the input voltage continues to drop as indicated by 670, the increase in voltage at the node 401 causes the pmos transistor 444 to begin conducting current. Now, a DC current flows through the transistors 442,444,443 and 445 (410 is on but 420 is not on) of the circuit 400. This current causes the voltage at the nodes 402 and 403 to increase. An increase in voltage at the node 403 results in a decrease in the current flowing through the Schmitt trigger pmos transistor 410.

A further decrease in the input voltage indicated by 675, brings about a voltage drop across the nmos transistor 443. This causes the Schmitt trigger nmos transistor 420 to begin conducting current resulting in a rapid increase in the voltage at the node 402. As a result of this voltage increase, the current through the nmos transistor 443 decreases. The weakening of the current flow through the nmos transistor 443 causes the voltage at the node 403 to rapidly increase. Consequently, the current through the pmos transistors 442, 444 and 410 begins to decrease.

When the input voltage is approximately $V_{IL}$ indicated by 580, the voltage at the node 403 is sufficiently high to shut off the pmos transistor 410. Further weakening of the pmos transistor 444 and the nmos transistor 443 occurs. At this point, the nodes 401 and 403 are pulled to their maximum values.

With the input voltage below $V_{IL}$ indicated by 690, the nmos transistor 443 is totally turned off, as the difference between the input voltage and the voltage at the node 402 is less than the value $V_{TH}$. With the nmos transistor 420 still on and the nmos transistor 445 weakened by the gate drive, the voltage at the node 402 rapidly increases toward $V_{cc}$.

Finally, with the input voltage less than $V_{TH}$ indicated by 695, the nmos transistor 445 is cut off and the voltage at the node 402 is clamped at the value $V_{cc}-V_{TH}$ by the saturated nmos transistor 420.

Thus, it will be seen from FIG. 7 with the Schmitt trigger circuit there is less of an opportunity for inadvertent switching of the circuit while making transitions from low to high input voltages and vice versa. Further, the Schmitt trigger circuit allows for rapid switching of the input voltage value.

However, the exact shape of the hysteresis loop depends on the value of beta, defined as the ratio between width and length, for each of the transistors in the input level translator means and in the Schmitt trigger circuit. In order to maximize the advantages of incorporating the Schmitt trigger into the input buffer, the beta values of all the transistors must be properly matched so that the hysteresis transfer characteristic of the FIG. 7 resembles, as closely as possible, the more idealized hysteresis transfer characteristic of FIG. 2.

The beta values of the Schmitt trigger pmos transistor 410 and nmos transistor 420 are much smaller than the beta values of the input level translator transistors 442, 444, 443, 445 for the example shown above. As a result, the hysteresis transfer characteristic seen in FIG. 7, which reflects the performance of this embodiment 400 closely matches the more idealized hysteresis loop shown in FIG. 2. Stronger beta values of the Schmitt trigger transistor can be used to manipulate the width and the shape of the hysteresis circuit to match any desired shape.

Figure 8:
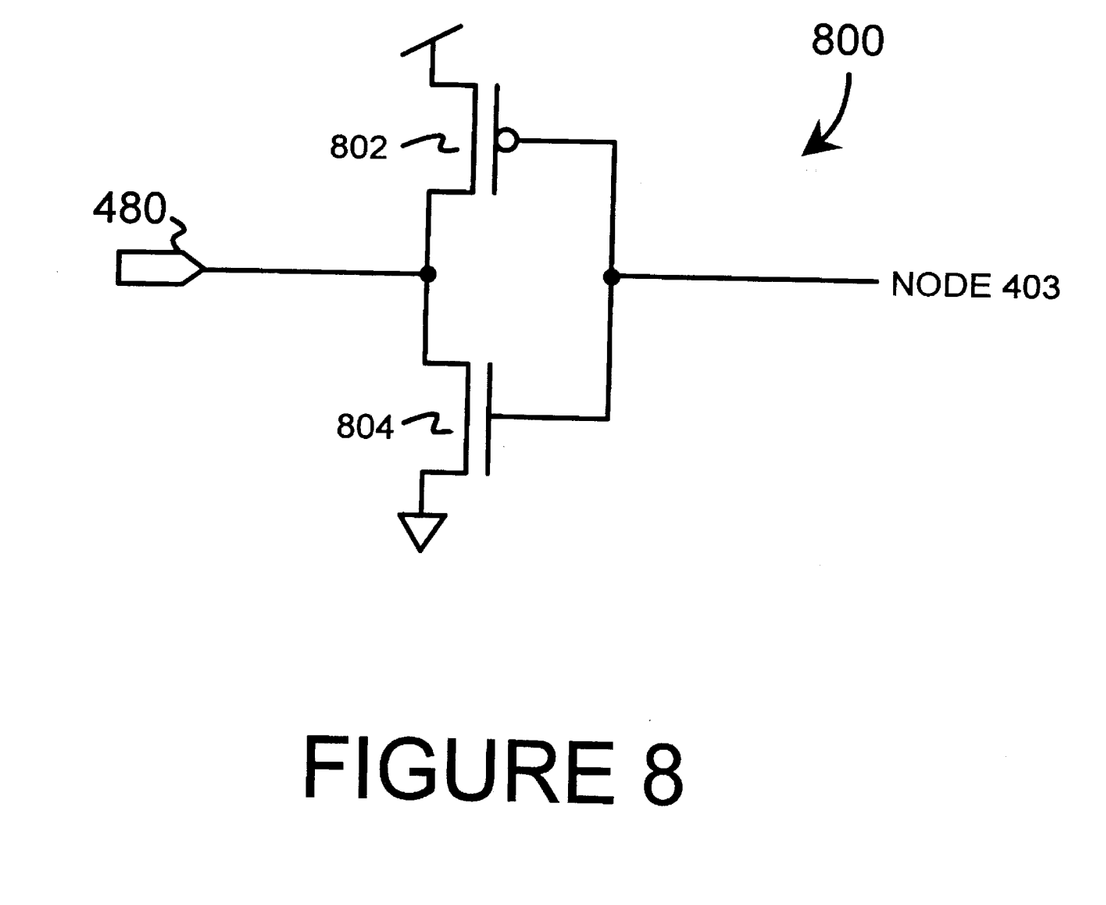
FIG. 8 illustrates an inverter circuit in the input buffer circuit in accordance with the present invention.

When the desired level translation cannot be obtained by the first stage of the level translator circuit, additional buffers such as the inverter 475 may be used to improve the correction until full CMOS levels are obtained. FIG. 8 illustrates a suitable inverter circuit 800 for use as the inverter 475. Inverter circuit 800 includes two transistors, a pmos transistor 802 and an nmos transistor 804. The pmos transistor 802 preferably acts a pull-up transistor, while the nmos transistor 804 preferably acts as a pull-down transistor. The beta values of the transistors 802 and 804 are chosen in order to obtain a desired level of correction for the output of full CMOS levels from the input buffer circuit.

For example, when the output of the Schmitt trigger level translator is more toward one CMOS voltage level and subsequently less toward the other CMOS voltage level, the beta values for transistors 802 and 804 are chosen to have the inverter 800 compensate for the Schmitt trigger level translator. Suitably, when the Schmitt trigger level translator corrects an input signal with greater ability toward the high CMOS voltage level, the pmos transistor 802 preferably has a higher beta value, i.e., is stronger, than the nmos transistor 804, so that the low level output of the Schmitt trigger level translator is closer to the CMOS high level voltage by inversion through the inverter circuit 800. Conversely, when the output of the Schmitt trigger level translator corrects an input signal with greater ability toward the CMOS low level, the nmos transistor 802 has a higher beta value than the pmos transistor 804 to bring the high level output of the Schmitt trigger level translator closer to the low CMOS level voltage by inversion through the inverter circuit 800.

Using ratioed values for the transistors 802 and 804 in the inverter circuit 800 in cooperation with the operation of the Schmitt trigger level translator allows the voltage output levels from the overall input buffer circuit of the present invention to be closer to CMOS high and low voltage levels. Thus, the inverter circuit 800 provides compensation for the Schmitt trigger level translator to further enhance the input buffer circuit's ability to provide a full CMOS voltage swing.

Therefore, one of ordinary skill in the art will understand the present invention provides better noise immunity and sharper switching edges as a result of including a means for providing a hysteresis transfer characteristic to the input signal level in the CMOS input buffer. Thus, the present invention represents an improvement in input buffer circuit technology.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined solely by the following claims.

I claim:

1. An input buffer circuit for an integrated circuit (IC), the input buffer circuit for receiving input signals and providing output signals to an input of the integrated circuit, the input buffer circuit comprising:

means for translating an input signal level to a logical signal, wherein the translating means comprises a first pair of pmos transistors and a second pair of nmos transistors;

Schmitt trigger means coupled to the translating means for providing the logical signal to the input of the IC and for providing a hysteresis transfer characteristic to the input signal such that a predetermined input signal must be above a first predetermined voltage or below a second predetermined voltage for the logical signal to be provided to the IC; and single buffer means, coupled to the Schmitt trigger means and the IC for providing a necessary level translation of the logical signal to the IC, the single buffer means further comprising a ratioed pair of transistors, the ratioed pair of transistors comprising a pmos pull-up transistor and an nmos pull-down transistor and having beta values chosen to compensate for the Schmitt trigger means, wherein the pmos pull-up transistor has a higher beta value than the nmos pull-down transistor when the Schmitt trigger means outputs a high level signal closer to a high-level logical signal and wherein the nmos pull-down transistor has a higher beta value than the pmos pull-up transistor when the Schmitt trigger means outputs a low level signal closer to a low level logical Signal.

2. The input buffer according to claim 1 wherein the first predetermined voltage is 0.8 volts and the second predetermined voltage is 2 volts.

3. The input buffer circuit according to claim 1 which further comprises means coupled to translating means for providing a sleep signal to the translating means.

4. The input buffer circuit of claim 3 wherein the translating means further comprises:

at least a first pair of series-connected pmos transistors;

at least a second pair of series-connected nmos transistors, the at least a second pair of nmos transistors being series-connected to the at least a first pair of pmos transistors; and means coupled to first and second pairs of transistors for providing the logical signals to the input of the integrated circuit.

5. The input buffer according to claim 3 wherein the sleep signal providing means minimizes power consumption in the input buffer circuit when the sleep signal is active high.

6. The input buffer circuit according to claim 3 wherein the sleep function providing means minimizes power consumption in input buffer circuit when the sleep signal is active low.

7. An input buffer circuit for a CMOS integrated circuit (IC), the input buffer circuit receiving TTL signals and providing CMOS signals to the IC, the input buffer circuit comprising:

input level translator means for converting the TTL signal level to a CMOS signal level, wherein the input level translator means comprises a first pair of pmos transistors and a second pair of nmos transistors;

Schmitt trigger means coupled to the input level translator means for providing the CMOS signals to the CMOS IC and also for providing hysteresis transfer characteristic to a TTL signal such that the TTL signal must be above a first predetermined voltage or below a second predetermined voltage for the CMOS signal to be provided to the input of the CMOS IC; and single buffer means, coupled to the Schmitt trigger means and the IC for providing a necessary level translation of the logical signal to the IC, the single buffer means comprising a ratioed pair of transistors, the ratioed pair of transistors comprising a pmos pull-up transistor and an nmos pull-down transistor and having beta values chosen to compensate for the Schmitt trigger means, wherein the pmos pull-up transistor has a higher beta value than the nmos pull-down transistor when the Schmitt trigger means outputs a high level signal closer to a high level logical signal and wherein the nmos pull-down transistor has a higher beta value than the pmos pull-up transistor when the Schmitt trigger means outputs a low level signal closer to a low level logical signal.

8. The input buffer circuit of claim 7 wherein the translator circuit further comprises:

at least a first pair of series-connected pmos transistors;

at least a second pair of series-connected nmos transistors, the at least a second pair of nmos transistors being series-connected to the at least a first pair of pmos transistors; and means coupled to the first and second pairs of transistors for providing the logical output signal to the input of the integrated circuit.

9. The input buffer circuit according to claim 8 which includes means for minimizing power consumption in the input buffer circuit when a sleep signal is active high.

10. The input buffer circuit according to claim 8 which includes the means for minimizing power consumption in the input buffer circuit when a sleep signal is active low.

11. The input buffer circuit of claim 7 wherein the Schmitt trigger circuit further comprises:

a pmos transistor coupled to the first pair of pmos transistors; and an nmos transistor coupled to the second pair of nmos transistors, the gate of the nmos transistor being series-coupled to the gate of the pmos transistor.

12. An input buffer circuit for a CMOS integrated circuit (IC), the input buffer circuit comprising:

input level translator means for converting TTL signal having a minimum input signal voltage $V_{IL}$ and a maximum input voltage $V_{IH}$, into an operational CMOS signal for use inside the IC with a minimum CMOS signal level $V_{ss}$ as a logical zero and a maximum CMOS signal level $V_{cc}$ as a logical one, the input level translator further comprising: first pmos transistor coupled to a first node, the first node further coupled to a second pmos transistor; third nmos transistor coupled to a second node, the second node further coupled to a fourth nmos transistor; the second pmos transistor coupled to a third node, the third node further coupled to the third nmos transistor; and the first and the second pmos transistors and the third and the fourth nmos transistors forming a plurality of input level translator transistors, the plurality thus formed being parallel-connected to the input of the input buffer circuit, an inverter coupled between an output and the third node;

a Schmitt trigger circuit coupled to the input level translator means for providing a hysteresis transfer characteristic to the TTL signal, the Schmitt trigger circuit further comprising: fifth pmos transistor coupled to a sixth nmos transistor and to the first node and the sixth nmos transistor further being coupled to the second node;

the fifth pmos and sixth nmos transistors of the Schmitt trigger having a beta value much smaller than the first and second pmos transistors and the third and fourth nmos transistors of the input level translating means such that the hysteresis transfer characteristic closely matches an idealized hysteresis transfer characteristic;

single buffer means coupled to the Schmitt trigger means and the IC for providing a necessary level translation of a logical signal to the IC, the single buffer means comprising a pair of transistors of chosen beta values that compensate for the Schmitt trigger means, the pair of transistors comprising a pmos pull-up transistor and an nmos pull-down transistor and having beta values chosen to compensate for the Schmitt trigger means, wherein the pmos pull-up transistor has a higher beta value than the nmos pull-down transistor when the Schmitt trigger means outputs a high level signal closer to a high level logical signal and wherein the nmos pull-down transistor has a higher beta value than the pmos pull-up transistor when the Schmitt trigger means outputs a low level signal closer to a low level logical signal; and means coupled to the input level transistor means for initiating a sleep function in the input buffer circuit responsive to a sleep function input signal.

13. The input buffer circuit of claim 12 in which the sleep function initiating means comprises a sleep function circuit responsive to the sleep signal from a sleep signal input being active high.

14. The input buffer circuit of claim 13 in which the sleep function circuit comprises:

seventh pmos transistor coupled to the sleep signal input, the seventh pmos transistor further being series-connected to the first pmos transistor; and eighth nmos transistor coupled to the sleep signal input, the eighth nmos transistor further coupled to the second node.

15. The input buffer circuit of claim 12 in which the sleep function initiating means comprises a sleep function circuit responsive to the sleep signal from a sleep signal input being active low.

16. The input buffer circuit of claim 15 in which the sleep function circuit comprises:

ninth pmos transistor coupled to the sleep signal input means, the ninth pmos transistor further coupled to the third node; and a tenth nmos transistor coupled to the sleep signal input means and series-connected to the fourth nmos transistor.

\* \* \* \* \*